(12) United States Patent
Shindo et al.

(10) Patent No.: US 7,598,569 B2
(45) Date of Patent: Oct. 6, 2009

(54) SEMICONDUCTOR DEVICE

(75) Inventors: Akinori Shindo, Hokuto (JP);
Masatoshi Tagaki, Suwa (JP); Hideaki Kurita, Suwa (JP)

(73) Assignee: Seiko Epson Corporation (JP)

( * ) Notice: Subject to any disclaimer, the term of this patent is extended or adjusted under 35 U.S.C. 154(b) by 273 days.

(21) Appl. No.: 11/429,581

(22) Filed: May 5, 2006

(65) Prior Publication Data

US 2006/0289961 A1    Dec. 28, 2006

(30) Foreign Application Priority Data

Jun. 23, 2005    (JP)    ............................. 2005-183365

(51) Int. Cl.
    *H01L 29/78*    (2006.01)
(52) U.S. Cl. .................. 257/333; 257/E23.02; 438/225
(58) Field of Classification Search ................. 257/333, 257/E23.02, 328; 438/225
    See application file for complete search history.

(56) References Cited

U.S. PATENT DOCUMENTS

| | | | |
|---|---|---|---|
| 5,084,752 A | 1/1992 | Satoh et al. | |
| 6,130,485 A | 10/2000 | Hirai | |
| 6,268,642 B1 | 7/2001 | Hsuan et al. | |
| 6,441,467 B2 | 8/2002 | Toyosawa et al. | |
| 6,465,895 B1 | 10/2002 | Park et al. | |
| 6,500,750 B1 | 12/2002 | Shroff et al. | |
| 6,538,326 B2 | 3/2003 | Shimizu et al. | |
| 6,650,002 B1 | 11/2003 | Toyosawa et al. | |
| 6,713,381 B2 | 3/2004 | Barr et al. | |
| 6,818,936 B2 * | 11/2004 | Lin et al. ..................... | 257/300 |
| 6,864,562 B1 | 3/2005 | Toyosawa et al. | |
| 7,002,210 B2 | 2/2006 | Taya | |
| 7,008,850 B2 * | 3/2006 | Noda et al. .................. | 438/287 |
| 7,312,530 B2 | 12/2007 | Hashimoto et al. | |
| 2002/0000665 A1 * | 1/2002 | Barr et al. .................... | 257/758 |
| 2002/0076851 A1 * | 6/2002 | Eden et al. ................... | 438/106 |
| 2003/0036256 A1 * | 2/2003 | Efland et al. ................ | 438/613 |
| 2004/0075113 A1 * | 4/2004 | Nakayama ................... | 257/200 |
| 2005/0042853 A1 * | 2/2005 | Gasner et al. ............... | 438/612 |
| 2005/0258484 A1 * | 11/2005 | Itou ........................... | 257/341 |
| 2006/0017114 A1 * | 1/2006 | Chen et al. ................... | 257/371 |
| 2006/0027880 A1 | 2/2006 | Taya | |
| 2007/0007599 A1 | 1/2007 | Shindo et al. | |
| 2007/0007662 A1 | 1/2007 | Shindo et al. | |
| 2008/0284026 A1 | 11/2008 | Hashimoto et al. | |

FOREIGN PATENT DOCUMENTS

CN    1269607    10/2000

(Continued)

*Primary Examiner*—Jerome Jackson, Jr.
*Assistant Examiner*—Paul A Budd
(74) *Attorney, Agent, or Firm*—Harness, Dickey & Pierce, P.L.C.

(57) ABSTRACT

A semiconductor device including: a semiconductor layer; a transistor formed in the semiconductor layer and including a gate insulating layer and a gate electrode, the transistor being a high voltage transistor in which an insulating layer having a thickness greater than the thickness of the gate insulating layer is formed under an end portion of the gate electrode; an interlayer dielectric formed above the transistor; and an electrode pad formed above the interlayer dielectric and positioned over at least part of the gate electrode when viewed from a top side.

4 Claims, 1 Drawing Sheet

FOREIGN PATENT DOCUMENTS

| | | |
|---|---|---|
| CN | 1519937 | 8/2004 |
| CN | 1601735 | 9/2004 |
| JP | 11-008247 | 1/1999 |
| JP | 11-126790 | 5/1999 |
| JP | 2002-319587 | 10/2002 |
| JP | 2004-207509 | 7/2004 |
| JP | 3608393 | 10/2004 |
| JP | 2004-363173 | 12/2004 |
| JP | 2005-050963 | 2/2005 |
| KR | 1997-0077390 | 12/1997 |
| KR | 1999-0052264 | 7/1999 |
| KR | 1999-0070614 | 9/1999 |
| KR | 10-0302536 | 7/2001 |
| KR | 2001-0061082 | 7/2001 |
| KR | 2002-0030258 | 4/2002 |
| KR | 10-0419813 | 2/2004 |
| KR | 2007-0005498 | 1/2007 |
| KR | 2007-0005521 | 1/2007 |

\* cited by examiner

SEMICONDUCTOR DEVICE

Japanese Patent Application No. 2005-183365, filed on Jun. 23, 2005, is hereby incorporated by reference in its entirety.

BACKGROUND OF THE INVENTION

The present invention relates to a semiconductor device.

In related-art technology, when disposing a semiconductor element such as a MOS transistor under a pad, the characteristics of the semiconductor element may be impaired due to stress during bonding. Therefore, the pad formation region and the semiconductor element formation region of a semiconductor chip are separated when viewed from the top side. However, since the semiconductor chip has been reduced in size and increased in degree of integration, disposition of the semiconductor element under the pad has been demanded. JP-A-2002-319587 discloses such technology, for example.

SUMMARY

According to one aspect of the invention, there is provided a semiconductor device comprising:
a semiconductor layer;
a transistor formed in the semiconductor layer and including a gate insulating layer and a gate electrode, the transistor being a high voltage transistor (or a high breakdown voltage transistor) in which an insulating layer having a thickness greater than the thickness of the gate insulating layer is formed under an end portion of the gate electrode;
an interlayer dielectric formed above the transistor; and
an electrode pad formed above the interlayer dielectric and positioned over at least part of the gate electrode when viewed from a top side.

DETAILED DESCRIPTION OF THE EMBODIMENT

Figure 1A:
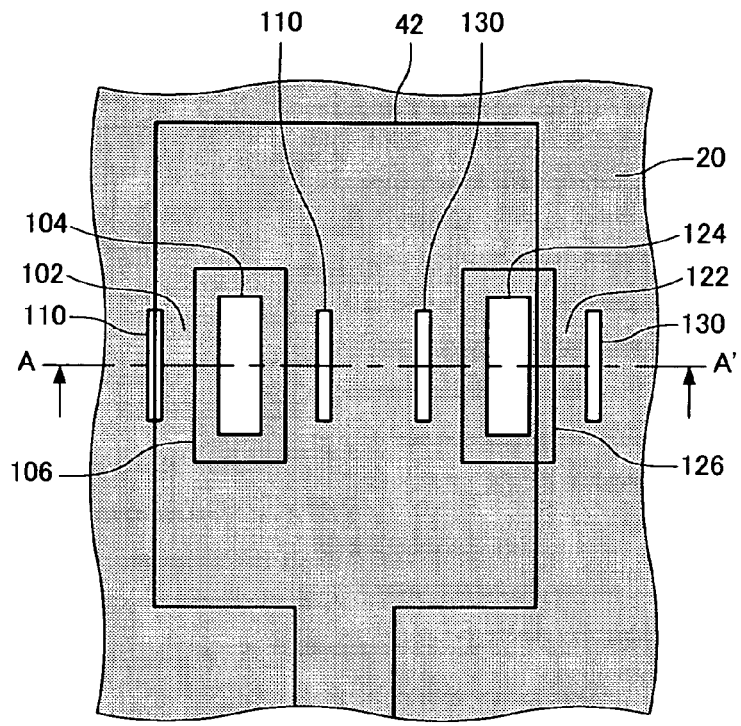
FIG. 1A is a plan view schematically showing a semiconductor device according to one embodiment of the invention.

The invention may provide a highly reliable semiconductor device in which a semiconductor element can be formed under a pad.

(1) According to one embodiment of the invention, there is provided a semiconductor device comprising:
a semiconductor layer;
a transistor formed in the semiconductor layer and including a gate insulating layer and a gate electrode, the transistor being a high voltage transistor in which an insulating layer having a thickness greater than the thickness of the gate insulating layer is formed under an end portion of the gate electrode;
an interlayer dielectric formed above the transistor; and
an electrode pad formed above the interlayer dielectric and positioned over at least part of the gate electrode when viewed from a top side.

In the semiconductor device according to this embodiment, the transistor is formed under the electrode pad, and the electrode pad is positioned over at least part of the gate electrode of the transistor when viewed from the top side. The transistor included in the semiconductor device according to this embodiment includes the insulating layer having a thickness greater than that of the gate insulating layer under the end portion of the gate electrode. For example, when the end portion of the gate electrode is formed on the semiconductor layer through a thin insulating layer, a stress mismatch may occur in the semiconductor layer at a position at which the end portion of the gate electrode is positioned. Such a stress mismatch may cause the gate insulating layer to deteriorate when the semiconductor layer is continuously subjected to stress occurring during formation of the electrode pad or the bump or to internal stress of the bump. As a result, the characteristics of the semiconductor device may deteriorate due to leakage current or the like. However, the semiconductor device according to this embodiment can prevent this problem since the end portion of the gate electrode is formed on the insulating layer having a thickness greater than that of the gate insulating layer. As a result, a semiconductor device can be provided in which a change in characteristics does not occur even if the semiconductor element is disposed under the electrode pad.

Moreover, the size of the semiconductor chip can be reduced by disposing the semiconductor element under the electrode pad (bump). Therefore, the number of semiconductor chips formed on one wafer can be increased, whereby the manufacturing cost can be reduced.

In the embodiments of the invention, the statement "a layer B formed above a layer A" includes the case where the layer B is directly formed on the layer A and the case where another layer is provided between the layer A and the layer B.

The semiconductor device according to this embodiment may have the following features.

(2) The semiconductor device may comprise:
a passivation layer formed above the electrode pad and having an opening which exposes at least part of the electrode pad; and
a bump formed at least in the opening.

(3) In this semiconductor device, the electrode pad may be positioned over the entire gate electrode when viewed from the top side.

(4) In this semiconductor device, the thicker insulating layer of the transistor may be a local oxidation of silicon (LOCOS) insulating layer or a trench insulating layer.

In the semiconductor device according to the embodiments of the invention, the term "LOCOS insulating layer" includes an insulating layer formed by a LOCOS method and an insulating layer formed by a semi-recessed LOCOS method.

An embodiment of the invention is described below with reference to the drawings.

Figure 1B:
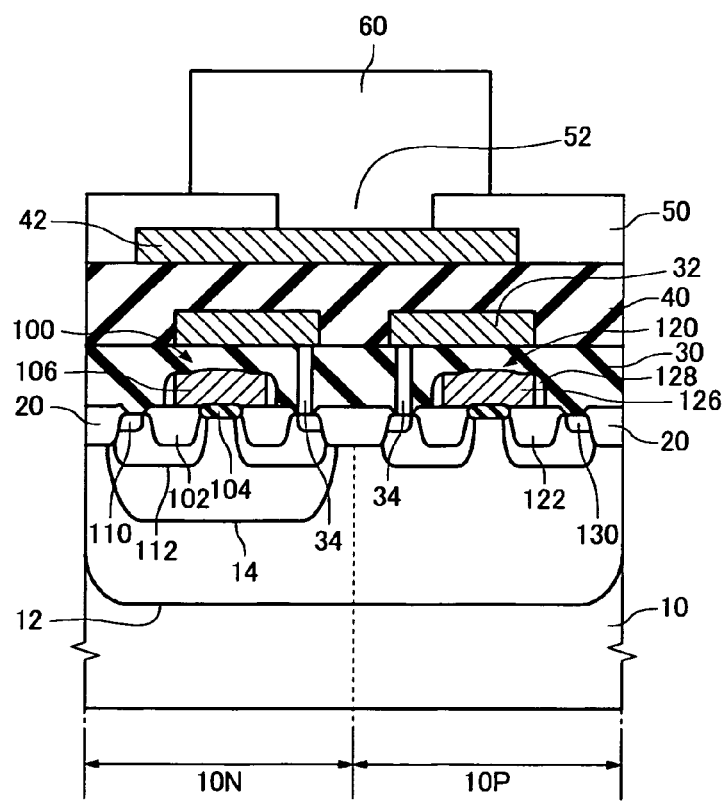
FIG. 1B is a cross-sectional view taken along the line A-A shown in FIG. 1A.

FIG. 1A is a plan view schematically showing a semiconductor device according to one embodiment of the invention. FIG. 1A schematically shows the positional relationship among an insulating layer (gray region), an impurity region, and a gate electrode (gate insulating layer) formed in a semiconductor layer and an electrode pad. FIG. 1B is a cross-sectional view along the line A-A shown in FIG. 1A. The semiconductor device according to this embodiment includes a first region 10N and a second region 10P defined by an element isolation insulating layer 20 formed in a semiconductor layer 10. An N-channel MIS transistor 100 is formed in the first region 10N, and a P-channel MIS transistor 120 is formed in the second region 10P.

The N-channel MIS transistor 100 is a high voltage transistor in which an insulating layer 102 (hereinafter may be called "offset insulating layer") having a thickness greater than that of a gate insulating layer 104 is formed under the end portion of a gate electrode 106. The P-channel MIS transistor 120 is a high voltage transistor in which an insulating layer 122 (hereinafter may be called "offset insulating layer") having a thickness greater than that of a gate insulating layer 124 is formed under the end portion of a gate electrode 126. The following description is given taking an example in which a P-type single crystal silicon substrate is used as the semiconductor layer 10. In the semiconductor device according to this embodiment, a local oxidation of silicon (LOCOS) insulating layer formed by a semi-recessed LOCOS method is used as the element isolation insulating layer 20 and the offset insulating layers 102 and 122 described later. Note that the element isolation insulating layer 20 and the offset insulating layers 102 and 122 are not limited as to type. For example, a LOCOS insulating layer formed by a LOCOS method or a trench insulating layer formed by a shallow trench isolation (STI) method may also be used.

A deep N-type well 12 is formed in the semiconductor layer 10 across the first region 10N and the second region 10P. In the N-type well 12, a P-type well 14 having a depth smaller than that of the N-type well 12 is formed in the first region 10P. If necessary, a shallow N-type well may be formed in the N-type well 12 in the second region 10P (not shown in FIG. 1B).

The N-channel MIS transistor 100 and the P-channel MIS transistor 120 are described below.

The N-channel MIS transistor 100 includes the offset insulating layer 102 formed in the semiconductor layer 10 in the first region 10N, the gate insulating layer 104 formed on the N-type well 14, the gate electrode 106, a sidewall insulating layer 108 formed on the side surface of the gate electrode 106, and an impurity region 110 formed in the N-type well 14 outside the gate electrode 106. The impurity region 110 serves as a source region or a drain region. A low-concentration impurity region 112 having an impurity concentration lower than that of the impurity region 110 is formed under the offset insulating layer 102. As shown in FIG. 1A, an electrode pad 42 is positioned over a part of the gate electrode 126 when viewed from the top side.

The P-channel MIS transistor 120 includes the offset insulating layer 122 formed in the semiconductor layer 10 in the second region 10P, the gate insulating layer 124 formed on the P-type well 12, the gate electrode 126 formed on the gate insulating layer 124, a sidewall insulating layer 128 formed on the side surface of the gate electrode 126, and an impurity region 130 formed in the P-type well 12 outside the gate electrode 126. The impurity region 130 serves as a source region or a drain region. A low-concentration impurity region 132 having an impurity concentration lower than that of the impurity region 130 is formed under the offset insulating layer 122. As shown in FIG. 1A, the electrode pad 42 is positioned over the entire gate electrode 106 when viewed from the top side.

Interlayer dielectrics 30 and 40 and a passivation layer 50 are formed in that order so that the N-channel MIS transistor 100 and the P-channel MIS transistor 120 are covered therewith. An interconnect layer 32 is formed on the interlayer dielectric 30. The interconnect layer 32 may be electrically connected with the impurity region of the N-channel MIS transistor 100 or the P-channel MIS transistor 120 through a contact layer 34 formed in the interlayer dielectric 30.

The electrode pad 42 is formed on the interlayer dielectric 40. The electrode pad 42 is connected with an internal interconnect layer (not shown).

As the materials for the interlayer dielectrics 30 and 40, a known material may be used. An opening 52 which exposes at least part of the electrode pad 42 is formed in the passivation layer 50. The opening 52 may be formed so that only the center area of the electrode pad 42 is exposed. Specifically, the passivation layer 50 may be formed to cover the edge portion of the electrode pad 42. The passivation layer 50 may be formed of $SiO_2$, SiN, a polyimide resin, or the like. In the semiconductor device according to this embodiment, the term "electrode pad" refers to a region including a surface exposed through the opening 52 and having a width greater than that of the interconnect section.

In the semiconductor device according to this embodiment, a bump 60 is formed at least in the opening 52. Specifically, the bump 60 is formed on the exposed surface of the electrode pad 42. In the semiconductor device according to this embodiment shown in FIG. 1B, the bump 60 is also formed on the passivation layer 50. The bump 60 may include one or more layers and may be formed of a metal such as gold, nickel, or copper. An external shape of the bump 60 when viewed from the top side is not particularly limited. The external shape of the bump 60 may be a quadrilateral (including square and rectangle) or a circle. The external shape of the bump 60 may cover less area than that of the electrode pad 42, or may cover larger area than that of the electrode pad 42.

A barrier layer (not shown) may be formed under the bump 60. The barrier layer prevents diffusion between the electrode pad 42 and the bump 60. The barrier layer may include one or more layers. The barrier layer may be formed by sputtering. The barrier layer may have a function of increasing the adhesion between the electrode pad 42 and the bump 60. The barrier layer may include a titanium tungsten (TiW) layer. When the barrier layer includes two or more layers, the outermost surface of the barrier layer may be an electroplating feed metal layer (e.g. Au layer) for depositing the bump 60.

In the semiconductor device according to this embodiment, the MIS transistors 100 and 120 having the LOCOS offset structure are formed under the bump 60. In the MIS transistors 100 and 120 having the LOCOS offset structure, the end portion of the gate electrode 106 or 126 is formed on the offset insulating layer 102 or 122 formed in the semiconductor layer 10. Specifically, the MIS transistors 100 and 120 do not have a configuration in which the end portion of the gate electrode is formed on the semiconductor layer 10 through a thin insulating layer. Therefore, a stress mismatch of the semiconductor layer 10 on which the end portions of the gate electrodes 106 and 126 are positioned is reduced. A stress mismatch may cause the gate insulating layer to deteriorate when the semiconductor layer 10 is continuously subjected to stress occurring during formation of the electrode pad 42 or the bump 60 or to internal stress of the bump 60. According to the semiconductor device of this embodiment, this problem can be solved by disposing the end portions of the gate electrodes 106 and 126 on the offset insulating layers. Therefore, even if the semiconductor element is disposed under the electrode pad 42 (bump 60), the semiconductor device according to this embodiment can prevent deterioration of the characteristics of the semiconductor element, whereby a semiconductor device provided with high reliability and reduced in size can be provided. The number of semiconductor chips formed on one wafer can be increased by reducing the size of the semiconductor device. Therefore, the manufacturing cost per semiconductor chip can be reduced.

The semiconductor device according to this embodiment is described above taking the case where two interlayer dielectrics 30 and 40 are formed. Note that the number of interlayer dielectrics is not limited to two. For example, three or more interlayer dielectrics may be stacked. FIG. 1B illustrates the case where the electrode pad 42 (bump 60) is formed above two MIS transistors 100 and 120. Note that the electrode pad 42 (bump 60) may be formed over three or more MIS transistors.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device comprising:
   a transistor;
   an interlayer dielectric above the transistor; and
   an electrode pad above the interlayer dielectric,
   the transistor including:
   a source region and a drain region in a semiconductor layer;
   a gate insulating layer on the semiconductor layer;
   a gate electrode on the gate insulating layer;
   an insulating layer in the semiconductor layer surrounding the source region, the drain region and the gate insulating layer, the insulating layer having a thickness greater than that of the gate insulating layer; and
   opposite side surfaces along a longitudinal direction of the gate electrode are positioned on the insulating layer and at least a portion of the gate electrode overlaps the electrode pad in a plan view.

2. The semiconductor device as defined in claim 1, comprising:
   a passivation layer above the electrode pad and having an opening which exposes at least part of the electrode pad; and
   a bump at least in the opening.

3. The semiconductor device as defined in claim 1,
   wherein the electrode pad is positioned over the entire gate electrode in plan view.

4. The semiconductor device as defined in claim 1,
   wherein the insulating layer of the transistor comprises one of a local oxidation of silicon (LOCOS) insulating layer or a trench insulating layer.

* * * * *